(12) United States Patent
Lee

(10) Patent No.: US 12,288,754 B2
(45) Date of Patent: Apr. 29, 2025

(54) SEMICONDUCTOR DEVICE AND METHOD OF STACKING DEVICES USING SUPPORT FRAME

(71) Applicant: STATS ChipPAC Pte. Ltd., Singapore (SG)

(72) Inventor: GunHyuck Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 18/517,859

(22) Filed: Nov. 22, 2023

(65) Prior Publication Data

US 2024/0088060 A1  Mar. 14, 2024

Related U.S. Application Data

(62) Division of application No. 17/444,853, filed on Aug. 11, 2021, now Pat. No. 11,869,848.

(51) Int. Cl.
*H01L 23/552* (2006.01)
*H01L 23/00* (2006.01)
*H01L 25/065* (2023.01)

(52) U.S. Cl.
CPC ............ *H01L 23/552* (2013.01); *H01L 24/20* (2013.01); *H01L 25/0652* (2013.01); *H01L 2224/2205* (2013.01); *H01L 2924/3025* (2013.01)

(58) Field of Classification Search
CPC .................. H01L 24/20; H01L 23/552; H01L 2924/3025; H01L 23/562; H01L 23/585; H01L 25/0655; H01L 25/0652; H01L 25/50; H01L 2924/171–17798

USPC ................................... 257/678; 438/106, 121
See application file for complete search history.

(56) References Cited

U.S. PATENT DOCUMENTS

| | | | |
|---|---|---|---|
| 7,989,707 B2 | 8/2011 | Yamano et al. | |
| 8,299,595 B2 | 10/2012 | Yoon et al. | |
| 8,569,869 B2 | 10/2013 | Park et al. | |
| 10,510,733 B2 | 12/2019 | Kumar et al. | |
| 10,784,208 B2 | 9/2020 | Liao et al. | |
| 2012/0062439 A1 | 3/2012 | Liao et al. | |
| 2017/0033025 A1* | 2/2017 | Gu | H01L 24/97 |

(Continued)

FOREIGN PATENT DOCUMENTS

CN  111520619 A  8/2020

*Primary Examiner* — Didarul A Mazumder
(74) *Attorney, Agent, or Firm* — Robert D. Atkins; Atkins and Associates, P.C.

(57) ABSTRACT

A semiconductor device has a first substrate and a first electrical component disposed over the first substrate. A first support frame is disposed over the first substrate. The first support frame has a horizontal support channel extending across the first substrate and a vertical support brace extending from the horizontal support channel to the first substrate. The first support frame can have a vertical shielding partition extending from the horizontal support channel to the first substrate. An encapsulant is deposited over the first electrical component and first substrate and around the first support frame. A second electrical component is disposed over the first electrical component. A second substrate is disposed over the first support frame. A second electrical component is disposed over the second substrate. A third substrate is disposed over the second substrate. A second support frame is disposed over the second substrate.

21 Claims, 18 Drawing Sheets

(56) References Cited

U.S. PATENT DOCUMENTS

| | | |
|---|---|---|
| 2017/0345793 A1* | 11/2017 | Miyairi .................. H01L 24/02 |
| 2020/0251458 A1 | 8/2020 | Tsai et al. |
| 2020/0251618 A1 | 8/2020 | Tsai et al. |
| 2021/0257311 A1* | 8/2021 | Hsieh .................. H01L 23/5385 |

* cited by examiner

SEMICONDUCTOR DEVICE AND METHOD OF STACKING DEVICES USING SUPPORT FRAME

CLAIM TO DOMESTIC PRIORITY

The present application is a division of U.S. patent application Ser. No. 17/444,853, now U.S. Pat. No. 11,869,848, filed Aug. 11, 2021, which application is incorporated herein by reference.

FIELD OF THE INVENTION

The present invention relates in general to semiconductor devices and, more particularly, to a semiconductor device and method of stacking devices using a support frame.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices continue to increase in electrical functionality. More electrical functionality typically requires more internal components and more surface area. Yet surface area on a PCB comes at a premium. The common approach to achieve more electrical functionality in a given footprint is to vertically stack the semiconductor devices. Semiconductor die stacking requires structural support and vertical electrical interconnect, which are typically implemented with conductive vias embedded within encapsulant around the semiconductor die. Conductive vias and encapsulant have limited support capability, poor heat dissipation, and are subject to warpage.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
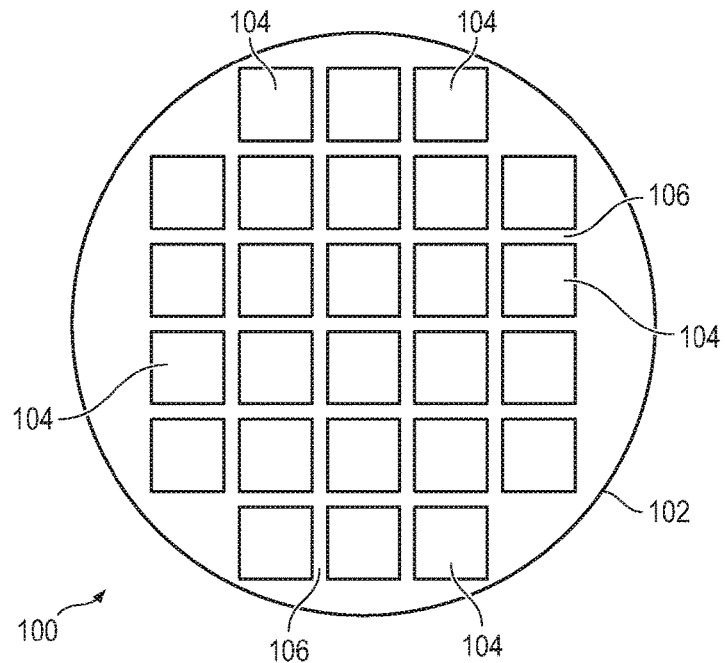
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
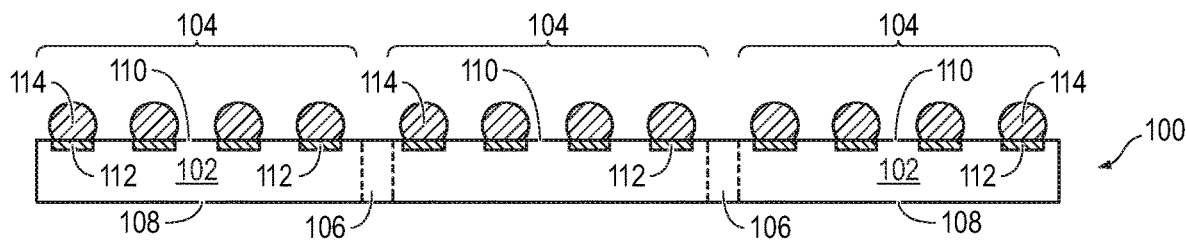

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
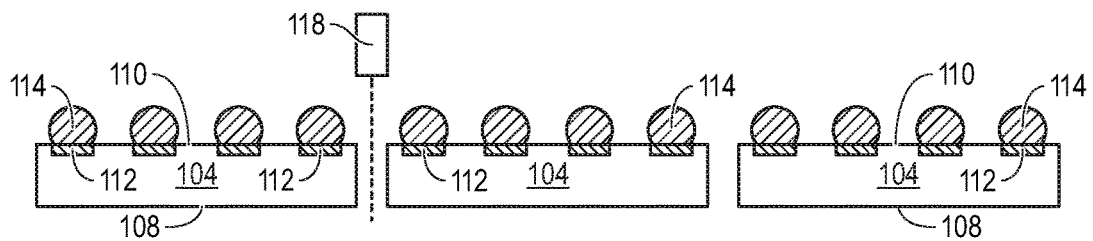

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
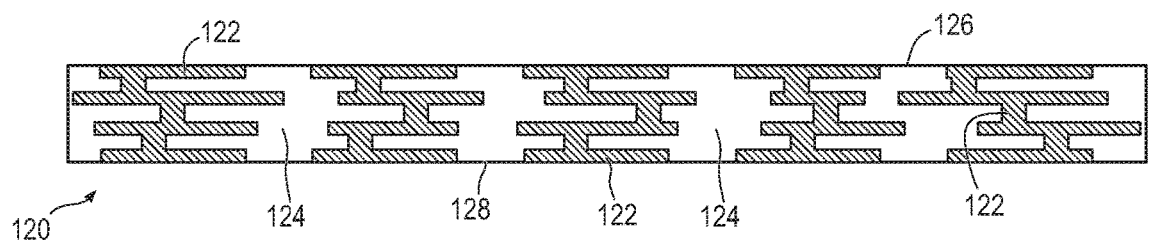
FIGS. 2a-2r illustrate a process of forming a semiconductor package with a support frame for structural support.
Figure 2B:
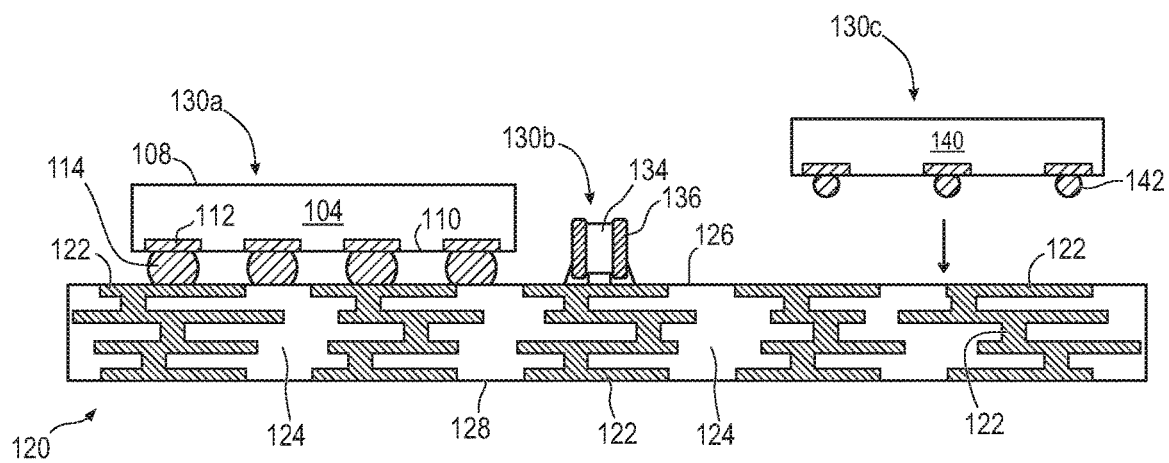
Figure 2C:
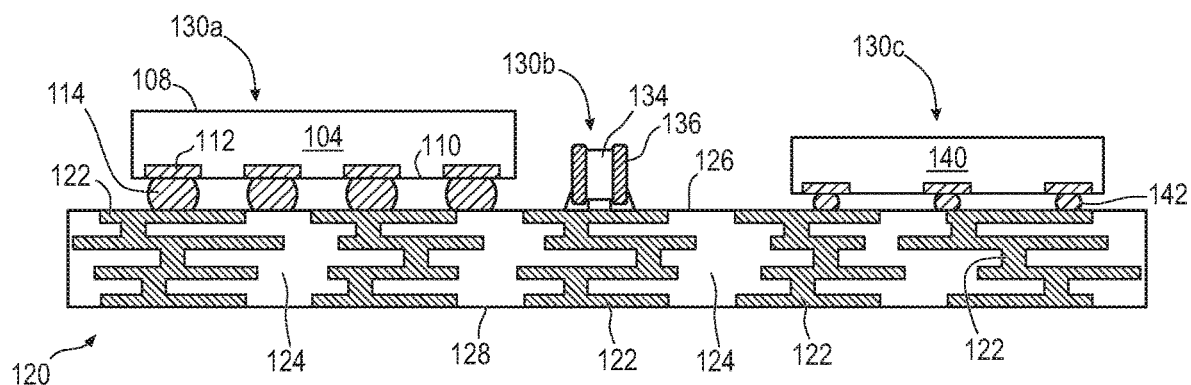
Figure 2D:
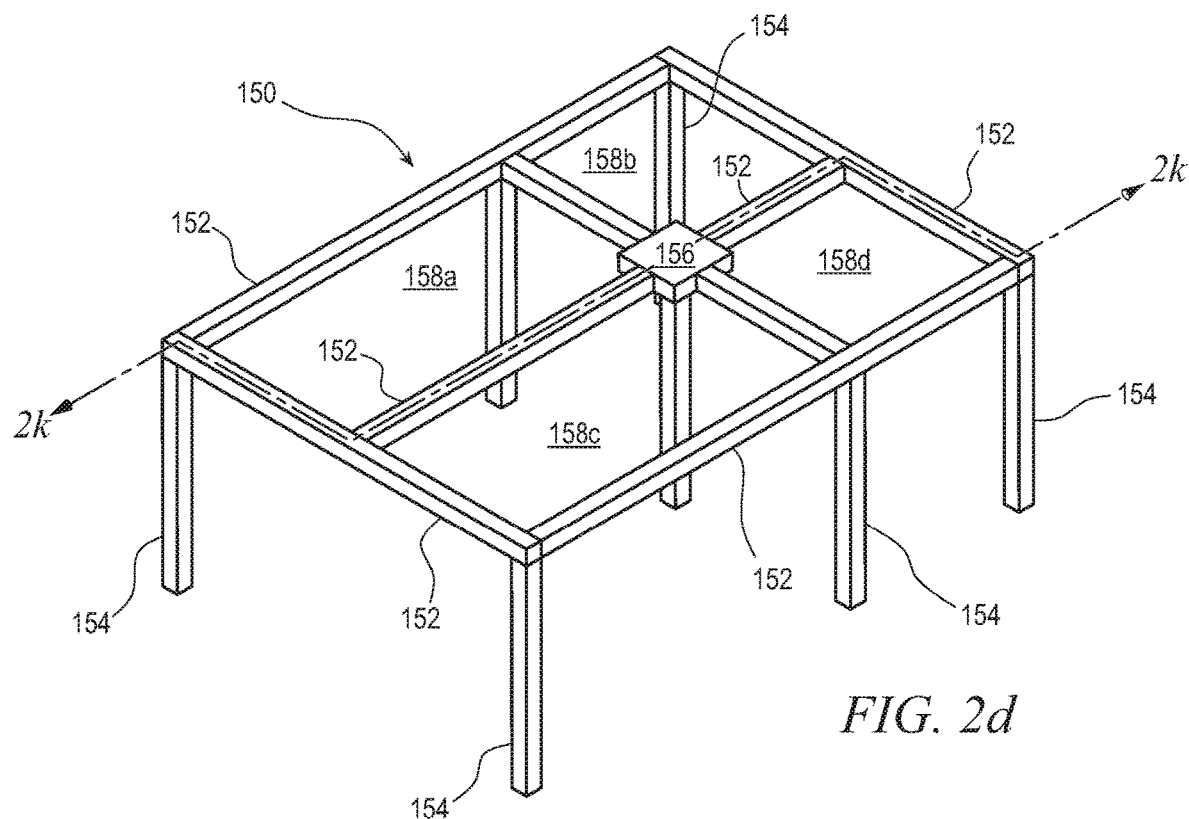
Figure 2E:
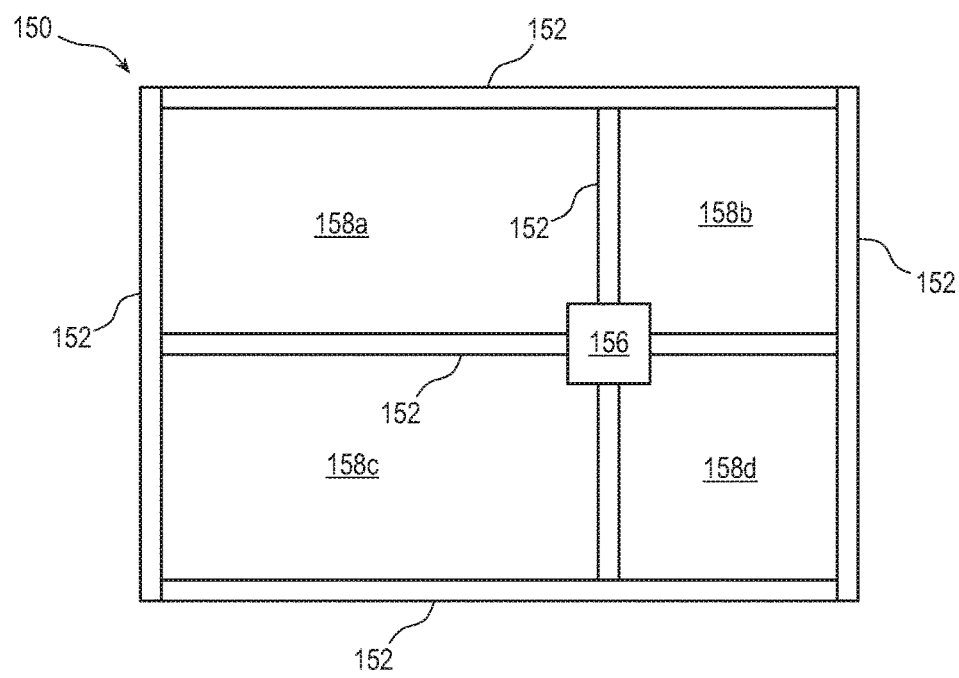
Figure 2F:
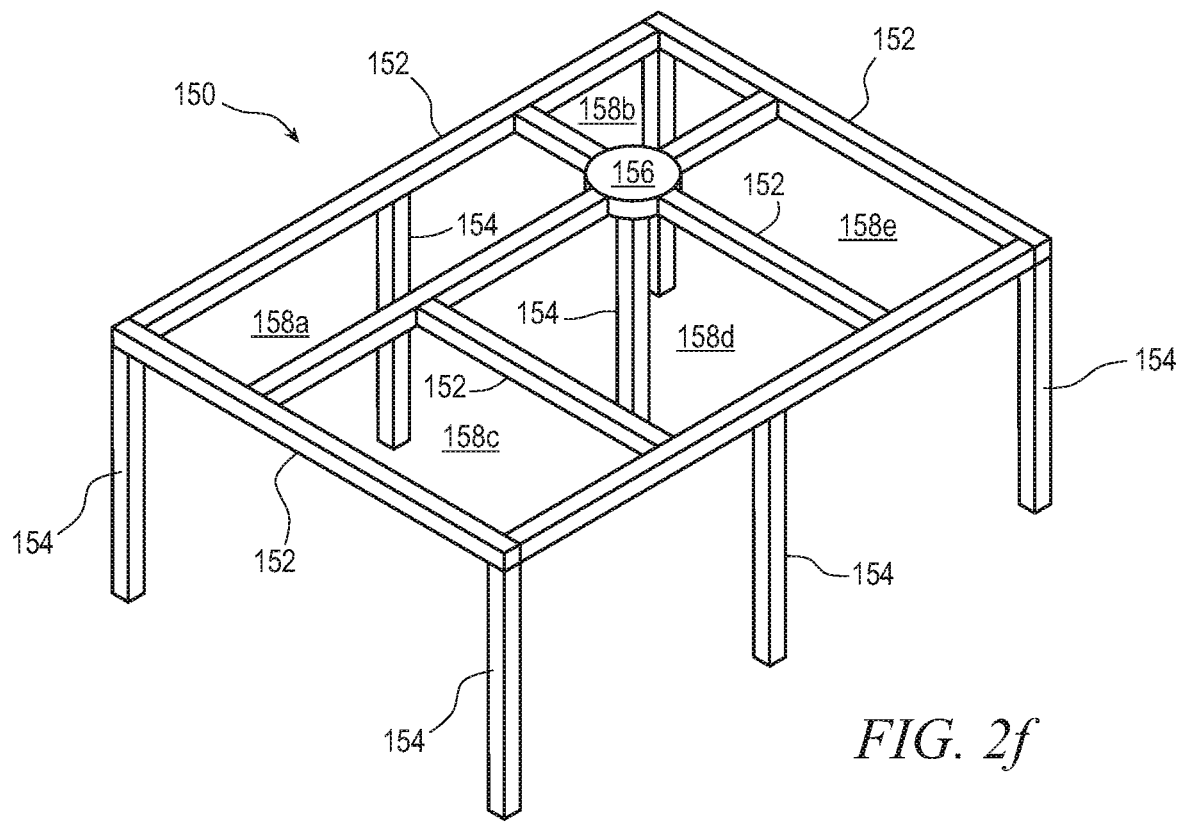
Figure 2G:
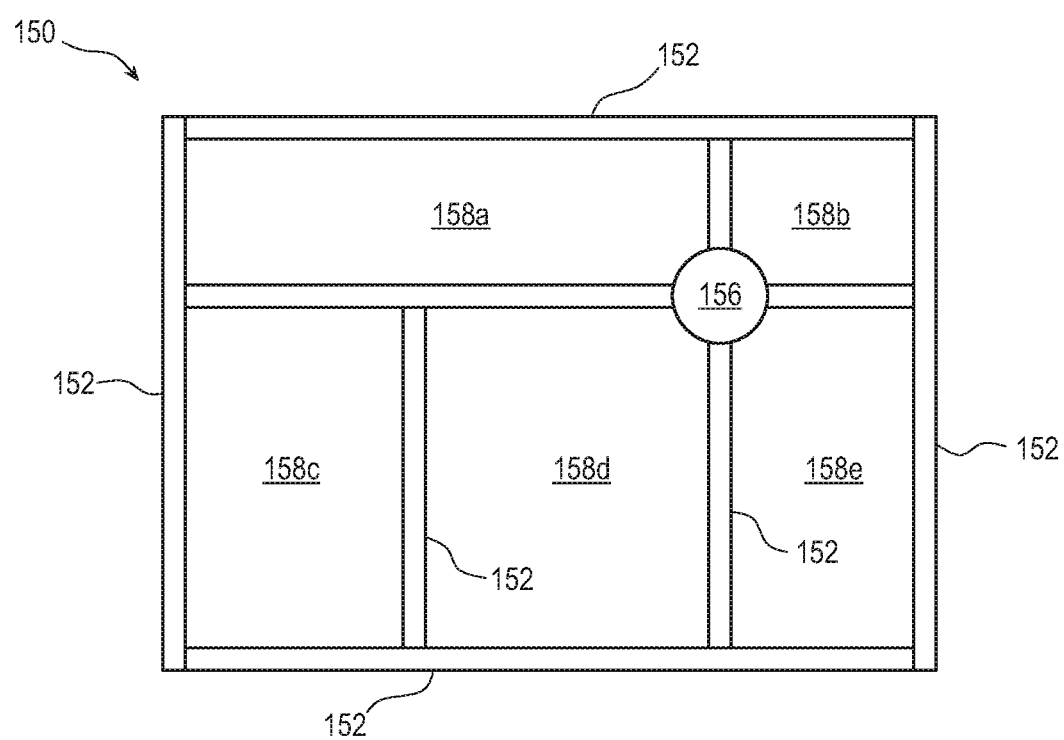
Figure 2H:
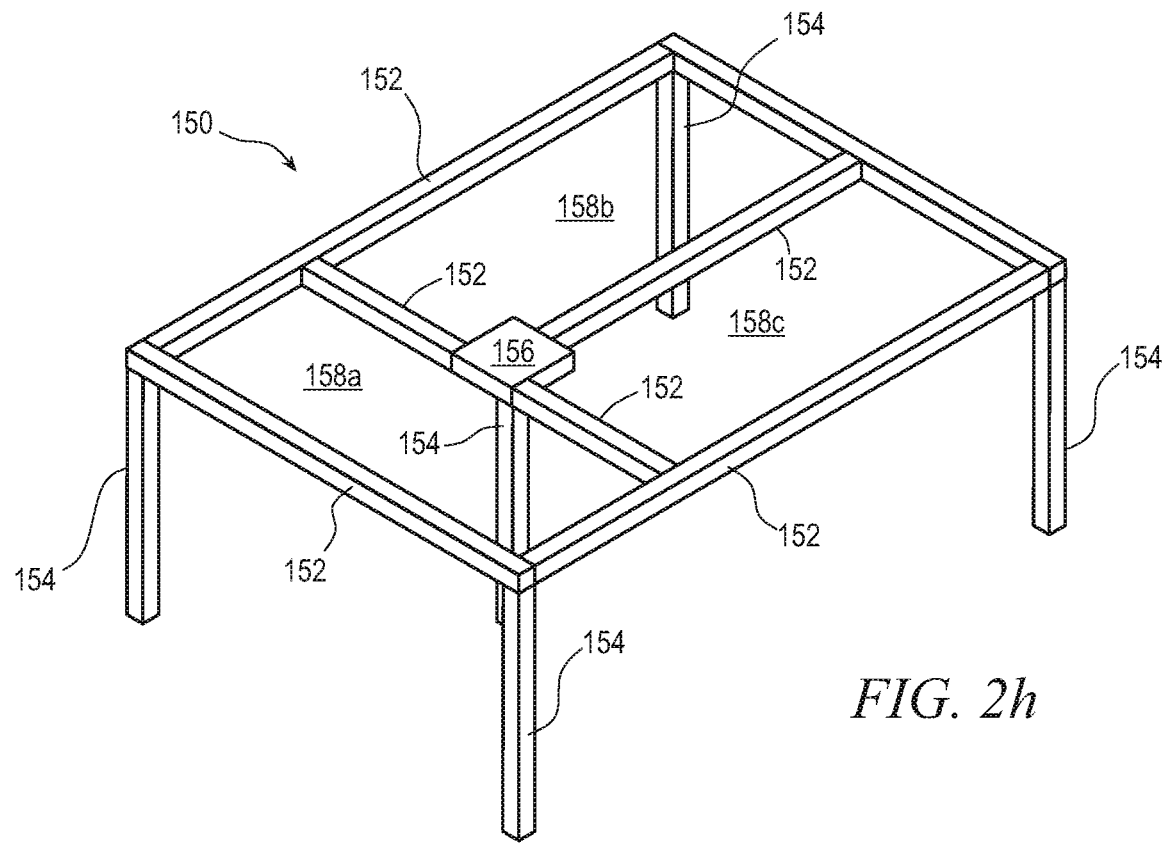
Figure 2I:
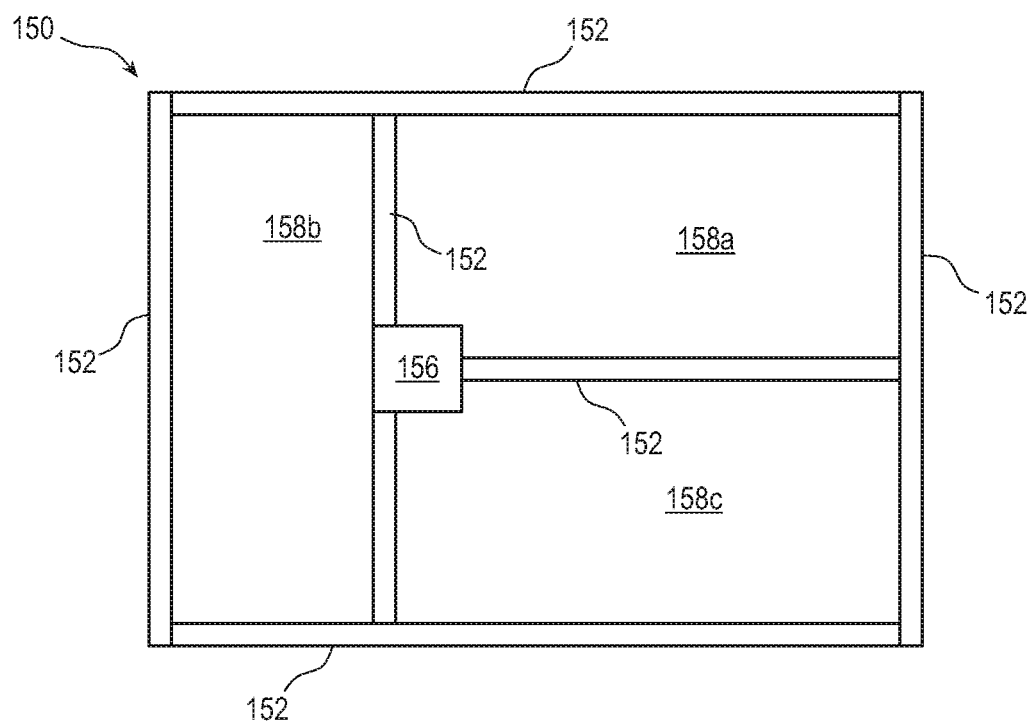
Figure 2J:
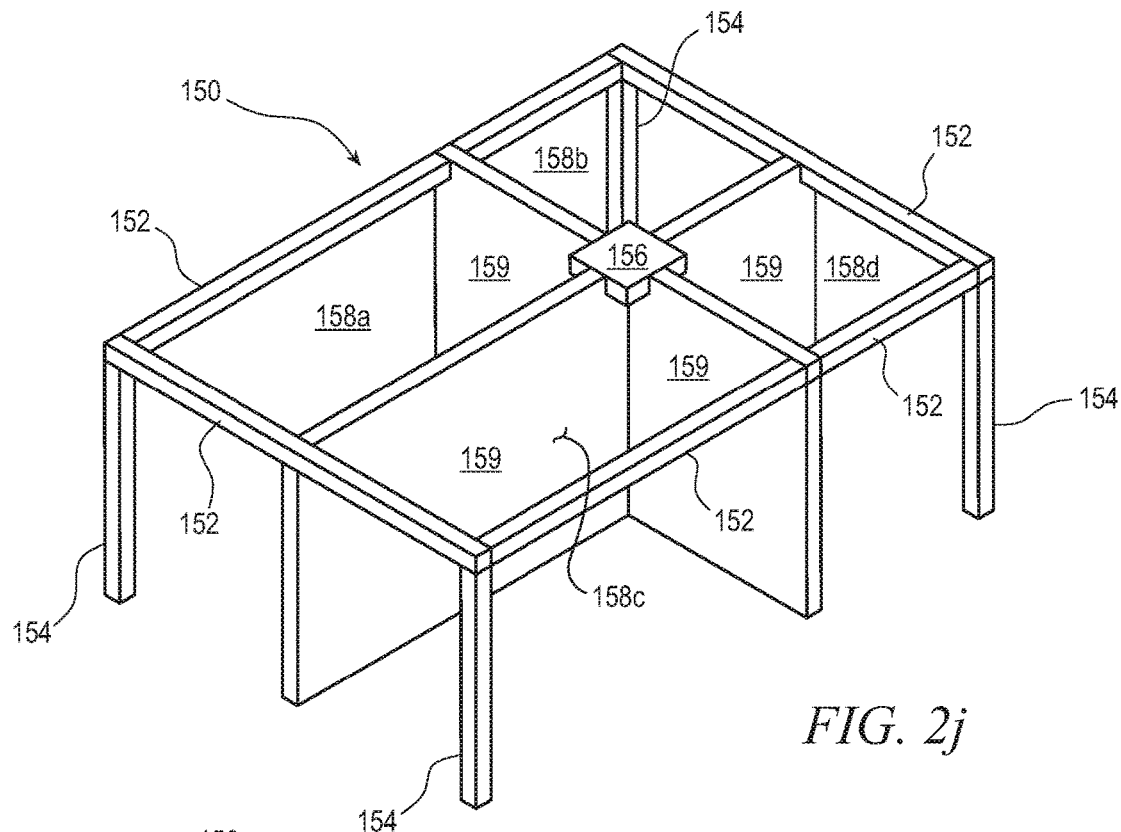
Figure 2K:
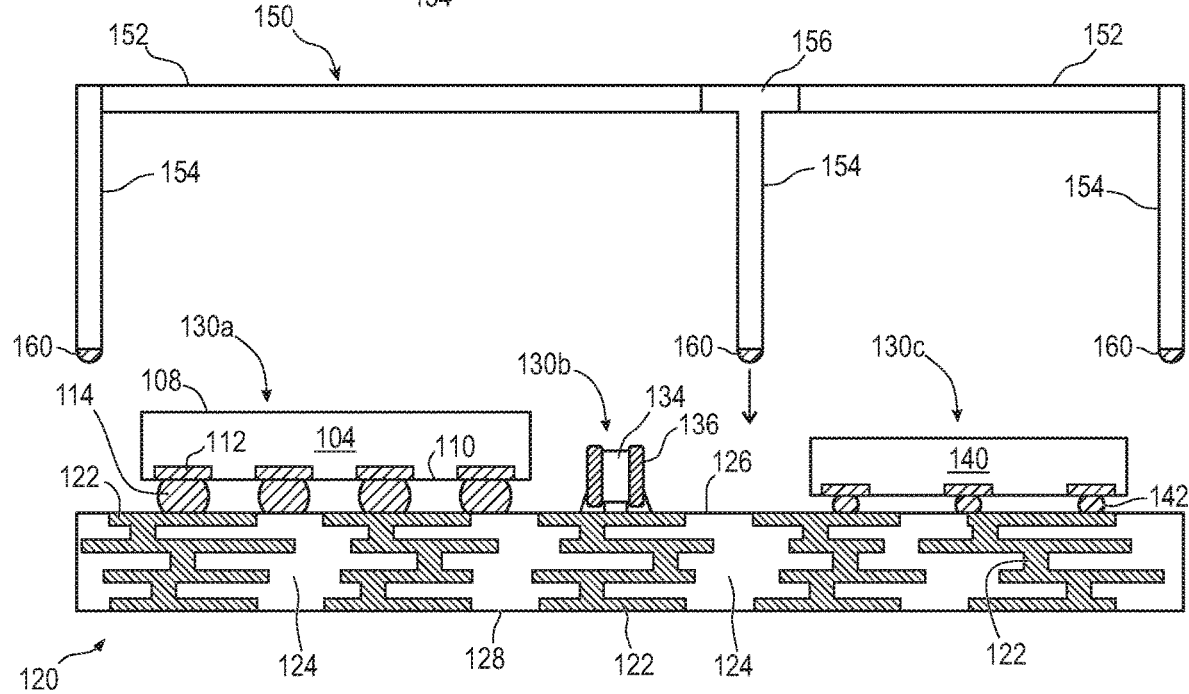
Figure 2L:
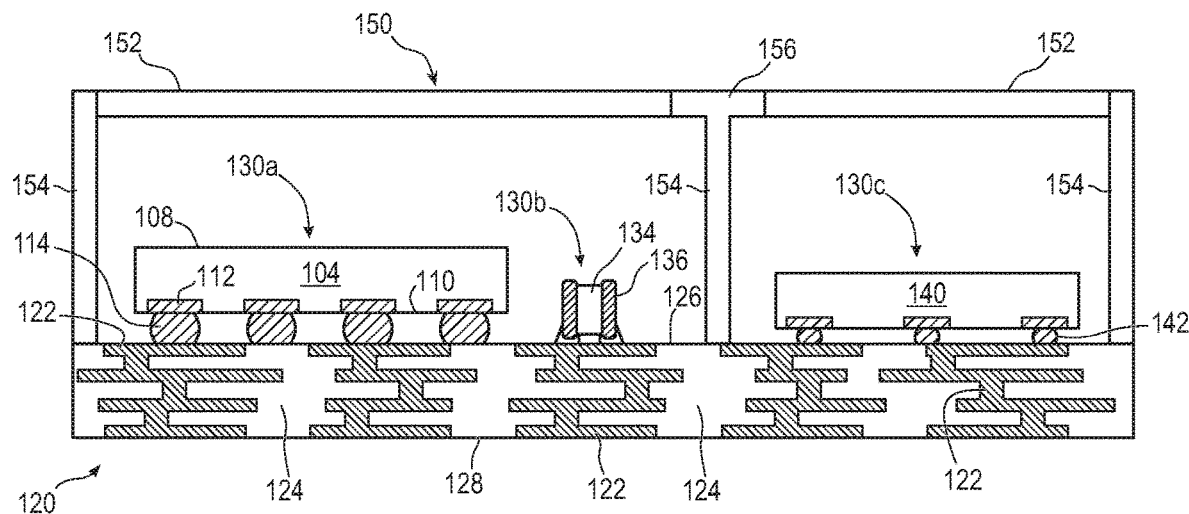
Figure 2M:
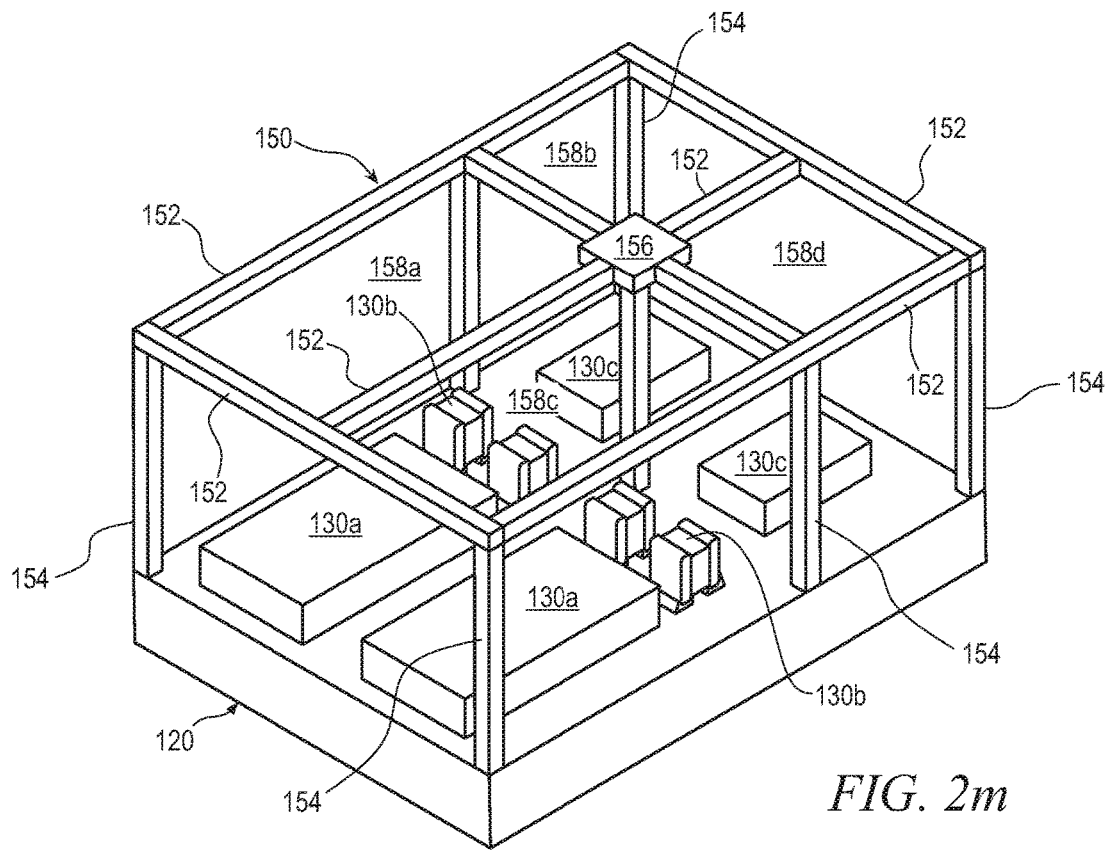
Figure 2N:
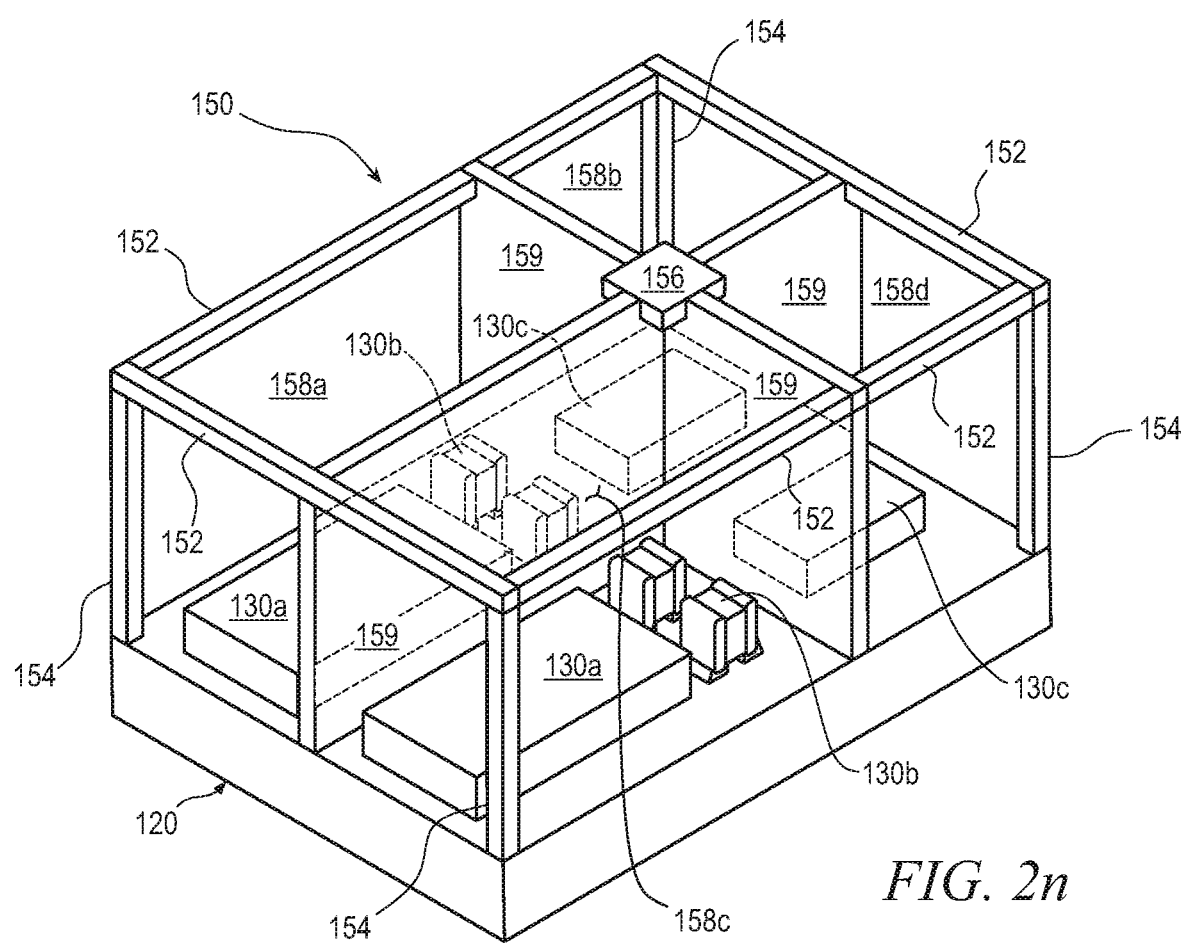
Figure 2O:
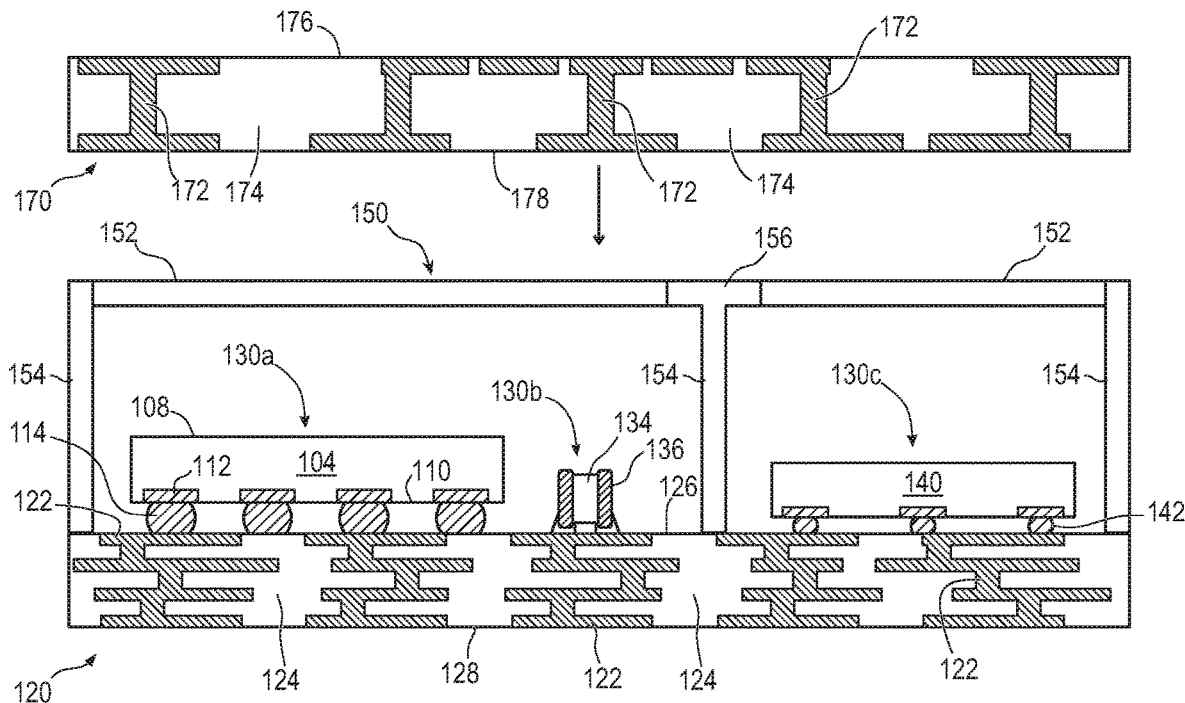
Figure 2P:
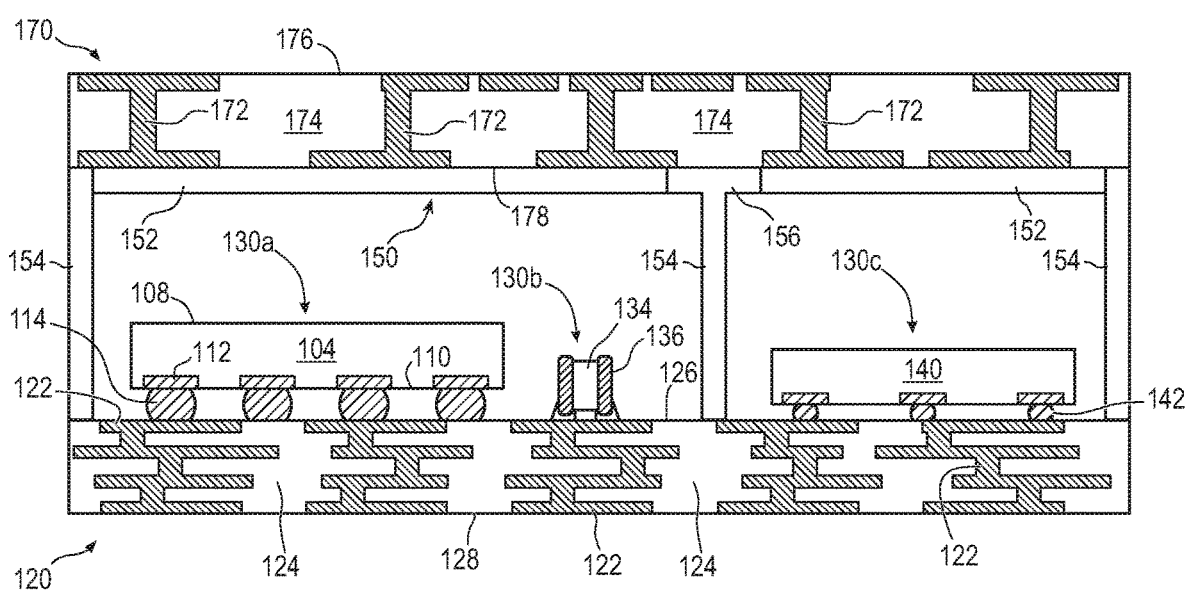
Figures 2Q, 2R:
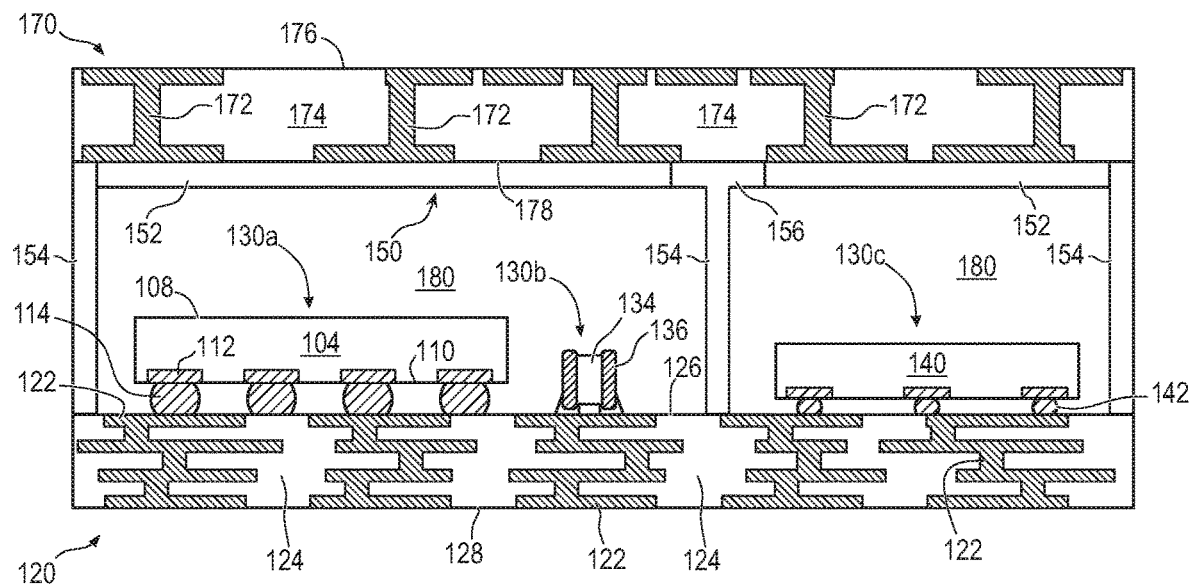

FIGS. 2a-2r illustrate a process of forming a semiconductor package with a support frame for structural support. FIG. 2a shows a cross-sectional view of interconnect substrate or PCB 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

In FIG. 2b, a plurality of electrical components 130a-130c is mounted to surface 126 of interconnect substrate 120 and electrically and mechanically connected to conductive layer 122. Electrical components 130a-130c are each positioned over substrate 120 using a pick and place operation. For example, electrical component 130a can be semiconductor die 104 from FIG. 1c with active surface 110 and bumps 114 oriented toward surface 126 of substrate 120 and electrically connected to conductive layer 122. Electrical component 130b can be discrete semiconductor device 134 such as a transistor, diode, capacitor, inductor, or resistor. Terminals 136 of discrete semiconductor device 134 are electrically connected to conductive layer 122. Electrical component 130c can be semiconductor die 140, made similar to semiconductor die 104, with a difference package type and device function. Bumps 142 on semiconductor die 140 are electrically connected to conductive layer 122 on surface 126. Alternatively, electrical components 130a-130c can include other semiconductor die, semiconductor package, surface mount device, discrete electrical device, discrete transistor, diode, or IPD. Electrical components 130a-130c are mounted to interconnect substrate 120, as shown in FIG. 2c, with bumps 114 and 142, terminals 136 making mechanical and electrical connection to conductive layer 122.

FIG. 2d illustrates a perspective view of support frame 150. Support frame 150 includes interconnected horizontal support channels 152, vertical support braces 154, and center pad 156. FIG. 2e is a top view of support frame 150 from FIG. 2d with horizontal support channels 152, vertical support braces 154, and center pad 156 arranged to provide compartments 158a-158d for electrical components 130a-130c. Horizontal support channels 152 and vertical support braces 154 can be stamped from a metal plate, similar to a leadframe, and bonded together with an adhesive. Alternatively, support frame 150 can be formed from 3D imaging. Support frame 150 can be made with Al, Cu, Sn, Ni, Au, Ag, or other structurally stable material. Alternatively support frame 150 can be carbonyl iron, stainless steel, nickel silver, low-carbon steel, silicon-iron steel, polymer, epoxy resin, and other metals and composites capable of providing structural support for a semiconductor package.

FIG. 2f illustrates another embodiment of support frame 150, with interconnected horizontal support channels 152, vertical support braces 154, and center pad 156. FIG. 2g is a top view of support frame 150 from FIG. 2f with horizontal support channels 152, vertical support braces 154, and center pad 156 arranged to provide compartments 158a-158e for electrical components 130a-130c.

FIG. 2h illustrates yet another embodiment of support frame 150, with interconnected horizontal support channels 152, vertical support braces 154, and center pad 156. FIG. 2i is a top view of support frame 150 from FIG. 2h with horizontal support channels 152, vertical support braces 154, and center pad 156 arranged to provide compartments 158a-158c for electrical components 130a-130c.

FIG. 2j illustrates yet another embodiment of support frame 150, with interconnected horizontal support channels 152, vertical support braces 154, and center pad 156 arranged to provide compartments 158a-158d for electrical components 130a-130c. In this case, solid vertical panels or partitions 159 provide RFI/EMI shielding isolation for electrical components 130a-130c in compartments 158a-158d.

Once electrical components 130a-130c are mounted to interconnect substrate 120, support frame 150 can be mounted to the interconnect substrate. In FIG. 2k, support frame 150 from FIG. 2d is positioned over surface 126 of interconnect substrate 120. Support frame 150 is shown in FIG. 2k as a cross-sectional view along line 2k-2k from FIG. 2d. Support frame 150 is lowered into place with support braces 154 contacting surface 126 between electrical components 130a-130c, as shown in FIG. 2l. Adhesive 160 bonds support braces 154 to surface 126 of interconnect substrate 120. In particular, support frame 150 provides structural support for electrical components, substrates, PCBs, and semiconductor packages disposed above the support frame. In addition, support frame 150 provides isolation between electrical components 130a-130b and electrical component 130c and external components. Support frame 150 can also provide vertical electrical interconnect, i.e., through metal vertical braces 154. FIG. 2m is a perspective view of support frame 150 mounted to interconnect substrate 120 with electrical components 130a-130c disposed in compartments 158a-158d. FIG. 2n is a perspective view of support frame 150 from FIG. 2j mounted to interconnect substrate 120 with electrical components 130a-130c disposed in compartments 158a-158d and separated by vertical panels 159 for RFI/EMI isolation and shielding.

FIG. 2o shows a cross-sectional view of interconnect substrate or PCB 170 including conductive layers 172 and insulating layer 174. Conductive layer 172 can be one or more layers of Al, Cu, Sn, Ni, Au, Ag, or other suitable electrically conductive material. Conductive layer 172 provides horizontal electrical interconnect across substrate 170 and vertical electrical interconnect between top surface 176 and bottom surface 178 of substrate 170. Portions of conductive layer 172 can be electrically common or electrically isolated depending on the design and function of semiconductor die 104 and other electrical components. Insulating layer 174 contains one or more layers of SiO2, Si3N4, SiON, Ta2O5, Al2O3, solder resist, polyimide, BCB, PBO, and other material having similar insulating and structural properties. Insulating layer 174 provides isolation between conductive layers 172.

Interconnect substrate 170 is positioned over support frame 150 and lowered into place with surface 178 contacting horizontal support channels 152 and center pad 156 of support frame 150, as shown in FIG. 2p. An adhesive can be used to bond interconnect substrate 170 to support frame 150. Alternatively, interconnect substrate 170 is bonded by dispensing or flux dipping. Accordingly, support frame 150 provides structural support for interconnect substrate 170 and any electrical components mounted to the interconnect substrate. Support frame 150 can also provide a ground connection between PCB 170, through horizontal support channels 152 and vertical support braces 154, to PCB 120. In one embodiment, each vertical support brace 154 can be a separate vertical conduction path.

In FIG. 2q, an encapsulant or molding compound 180 is deposited over electrical components 130a-130c and surface 126 of interconnect substrate 120 and around support frame 150 using a paste printing, compressive molding, transfer molding, liquid encapsulant molding, vacuum lamination, spin coating, or other suitable applicator. Support frame 150 has an opening on at least two sides to allow for free flow of encapsulant 180 across electrical components 130a-130c and support frame 150. Encapsulant 180 can be polymer composite material, such as epoxy resin with filler, epoxy acrylate with filler, or polymer with proper filler. Encapsulant 180 is non-conductive, provides structural support, and environmentally protects the semiconductor device from external elements and contaminants.

In FIG. 2r, an electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 184. In one embodiment, bump 184 is formed over a UBM having a wetting layer, barrier layer, and adhesive layer. Bump 184 can also be compression bonded or thermocompression bonded to conductive layer 122. Bump 184 represents one type of interconnect structure that can be formed over conductive layer 122. The interconnect structure can also use bond wires, conductive paste, stud bump, micro bump, or other electrical interconnect.

Semiconductor package 186 in FIG. 2r uses support frame 150 for structural support and isolation of electrical components 130a-130c. PCB 170 is stacked over PCB 120 containing electrical components 130a-130c and provides vertical electrical interconnect. Support frame 150 provides a rigid structural support for PCB 170 and other component vertical stacking, while reducing warpage and increasing heat dissipation through semiconductor package 186. Component stacking increases electrical functionality in a small package footprint. Support frame 150 can also provide RFI/EMI shielding for electrical components 130a-130c disposed in individual compartments 158a-158d, see FIGS. 2j, 2n. Support frame 150 can also provide a ground connection between PCB 170, through vertical support braces 154, to PCB 120 and bumps 184.

Figure 3A:
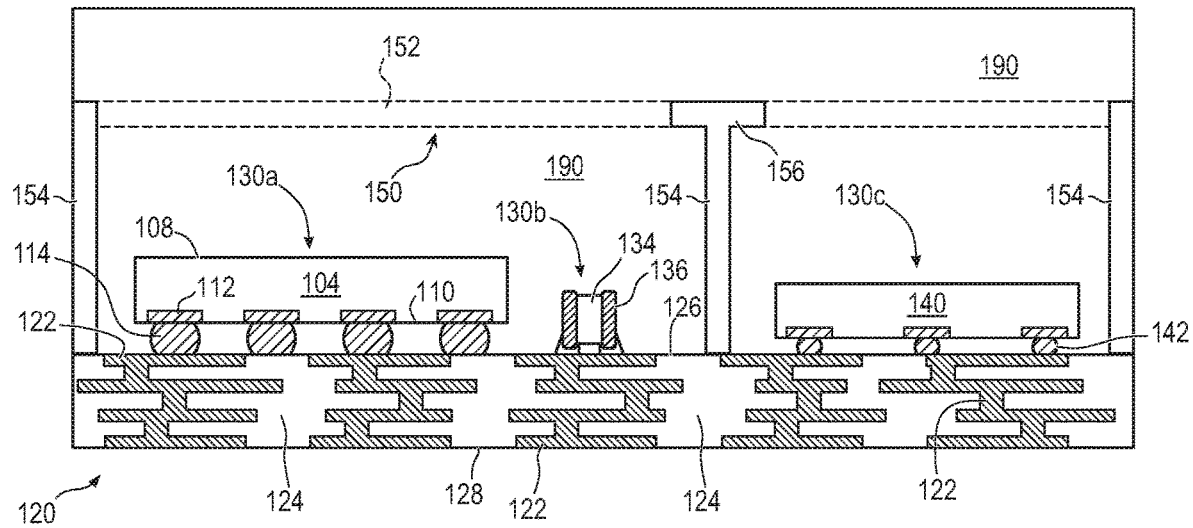
FIGS. 3a-3e illustrate another approach to forming a semiconductor package with a support frame for structural support.

FIGS. 3a-3e illustrate another process of forming a semiconductor package with a support frame for structural support. Continuing from FIGS. 2l-2m, an encapsulant or molding compound 190 is deposited over electrical components 130a-130c and surface 126 of interconnect substrate 120 and around support frame 150, as shown in FIG. 3a, using a paste printing, compressive molding, transfer molding, liquid encapsulant molding, vacuum lamination, spin coating, or other suitable applicator. Support frame 150 has an opening on at least two sides to allow for free flow of encapsulant 190 across electrical components 130a-130c and support frame 150. Encapsulant 190 can be polymer composite material, such as epoxy resin with filler, epoxy acrylate with filler, or polymer with proper filler. Encapsulant 190 is non-conductive, provides structural support, and environmentally protects the semiconductor device from external elements and contaminants.

Figure 3B:
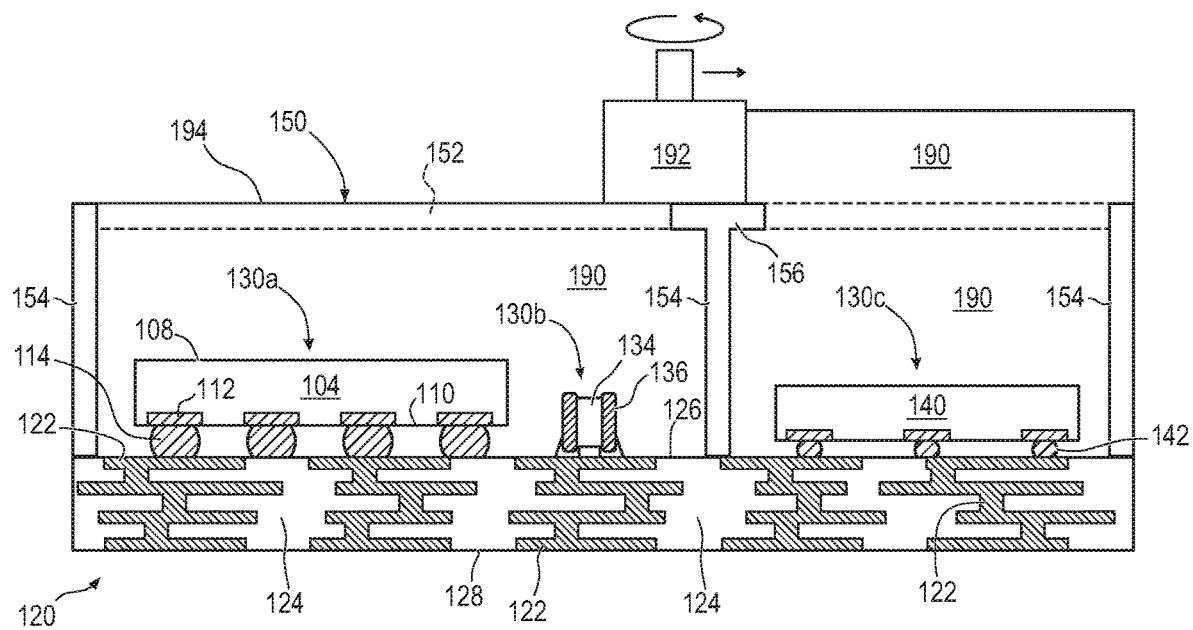
Figure 3C:
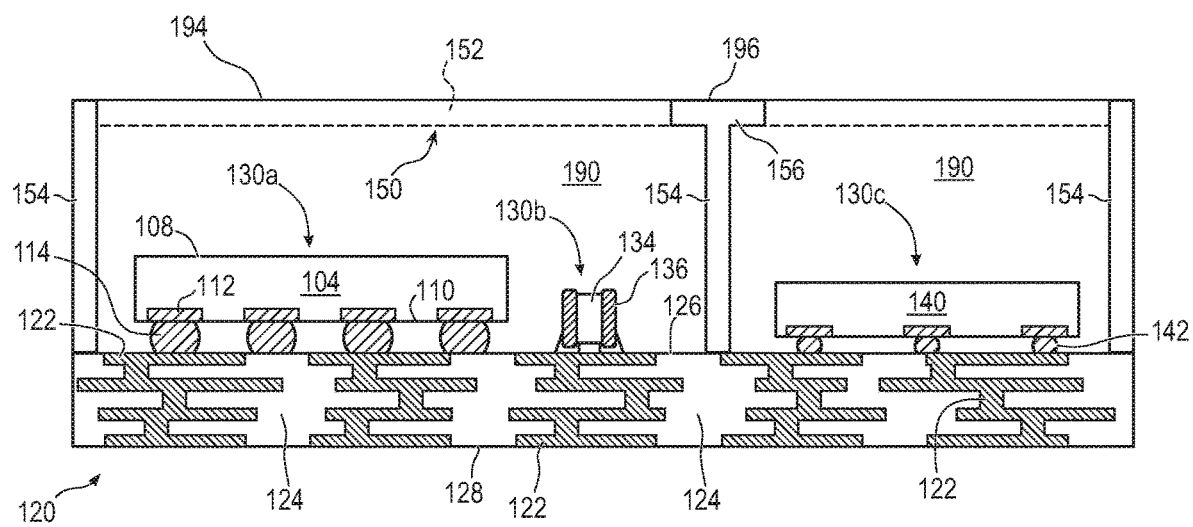

In FIG. 3b, a portion of encapsulant 190 is removed by grinder 192 to expose surface 194 of encapsulant 194 coplanar with top surface 196 of center pad 156. Grinder 192 planarizes surface 194 of encapsulant 190 and top surface 196 of center pad 156, as shown in FIG. 3c.

Figure 3D:
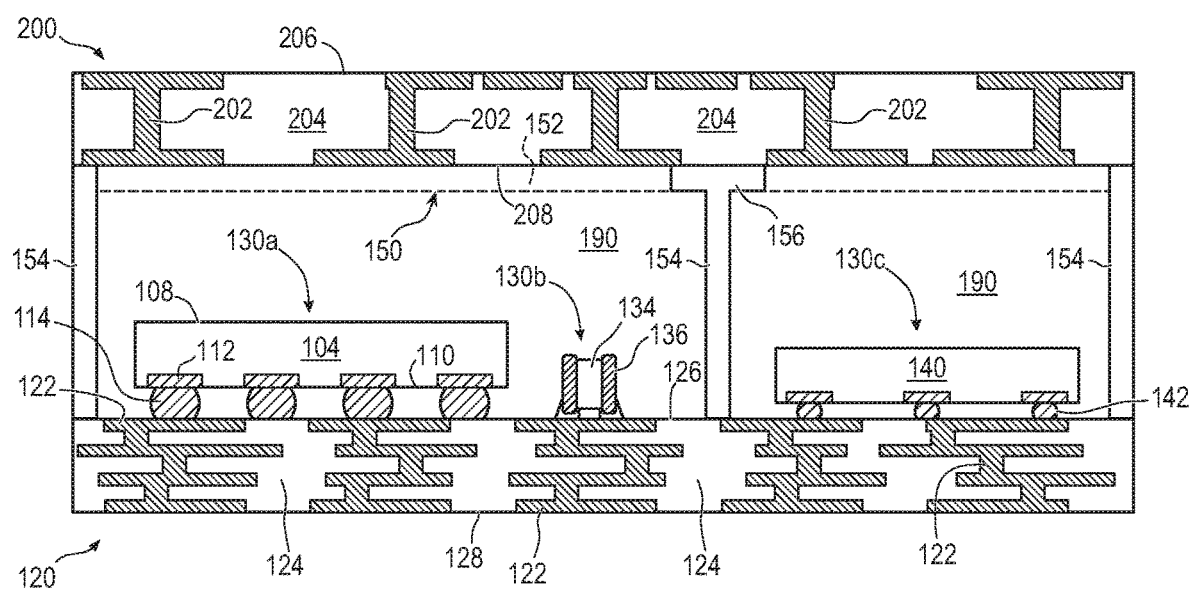

FIG. 3d shows a cross-sectional view of interconnect substrate or PCB 200 including conductive layers 202 and insulating layer 204. Conductive layer 202 can be one or more layers of Al, Cu, Sn, Ni, Au, Ag, or other suitable electrically conductive material. Conductive layer 202 provides horizontal electrical interconnect across substrate 200 and vertical electrical interconnect between top surface 206 and bottom surface 208 of substrate 200. Portions of conductive layer 202 can be electrically common or electrically isolated depending on the design and function of semiconductor die 104 and other electrical components. Insulating layer 204 contains one or more layers of SiO2, Si3N4, SiON, Ta2O5, Al2O3, solder resist, polyimide, BCB, PBO, and other material having similar insulating and structural properties. Insulating layer 204 provides isolation between conductive layers 202.

Interconnect substrate 200 is positioned over support frame 150 and encapsulant 190 and lowered into place with surface 178 contacting horizontal support channels 152 and center pad 156 of support frame 150, similar to FIGS. 2o and 2p. An adhesive can be used to bond interconnect substrate 200 to support frame 150. Accordingly, support frame 150 provides structural support for interconnect substrate 200 and any electrical components mounted to the interconnect substrate.

Figure 3E:
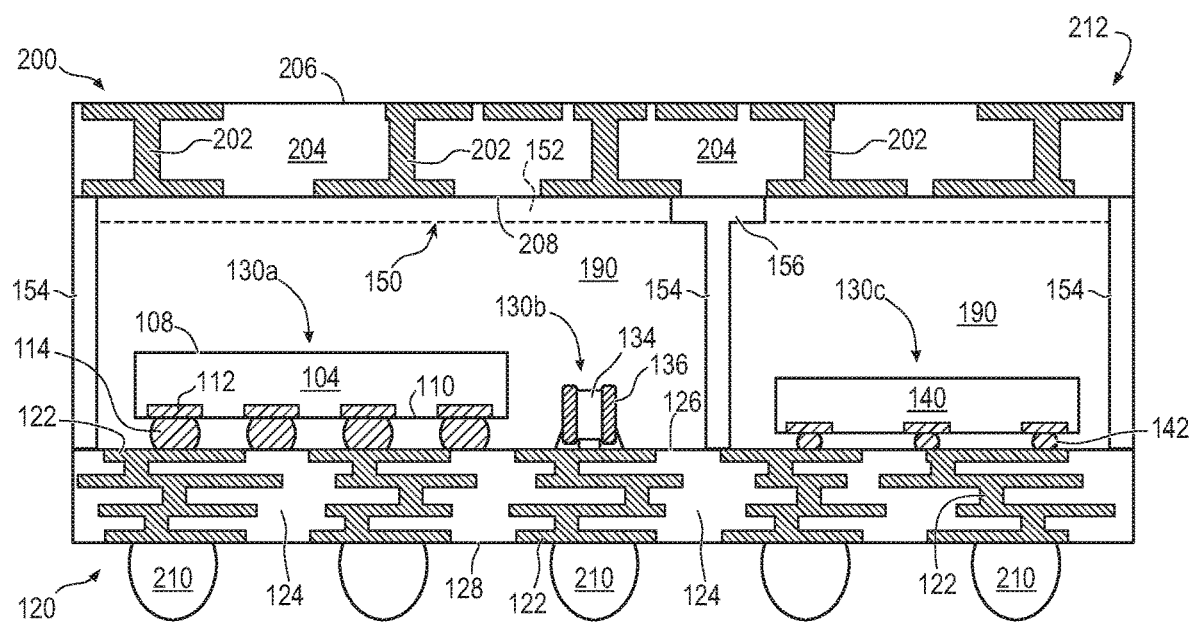

In FIG. 3e, an electrically conductive bump material is deposited over conductive layer 122 on surface 128 of interconnect substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 210. In one embodiment, bump 210 is formed over a UBM having a wetting layer, barrier layer, and adhesive layer. Bump 210 can also be compression bonded or thermocompression bonded to conductive layer 122. Bump 210 represents one type of interconnect structure that can be formed over conductive layer 122. The interconnect structure can also use bond wires, conductive paste, stud bump, micro bump, or other electrical interconnect.

Semiconductor package 212 in FIG. 3e uses support frame 150 for structural support and isolation of electrical components 130a-130c. PCB 200 is stacked over PCB 120 containing electrical components 130a-130c and provides vertical electrical interconnect. Support frame 150 provides a rigid structural support for PCB 200 and other component vertical stacking, while reducing warpage and increasing heat dissipation through semiconductor package 212. Component stacking increases electrical functionality in a small package footprint. Support frame 150 can also provide RFI/EMI shielding for electrical components 130a-130c disposed in individual compartments 158a-158d, see FIGS. 2j, 2n. Support frame 150 can also provide a ground connection between PCB 200, through vertical support braces 154, to PCB 120 and bumps 184.

Figure 4A:
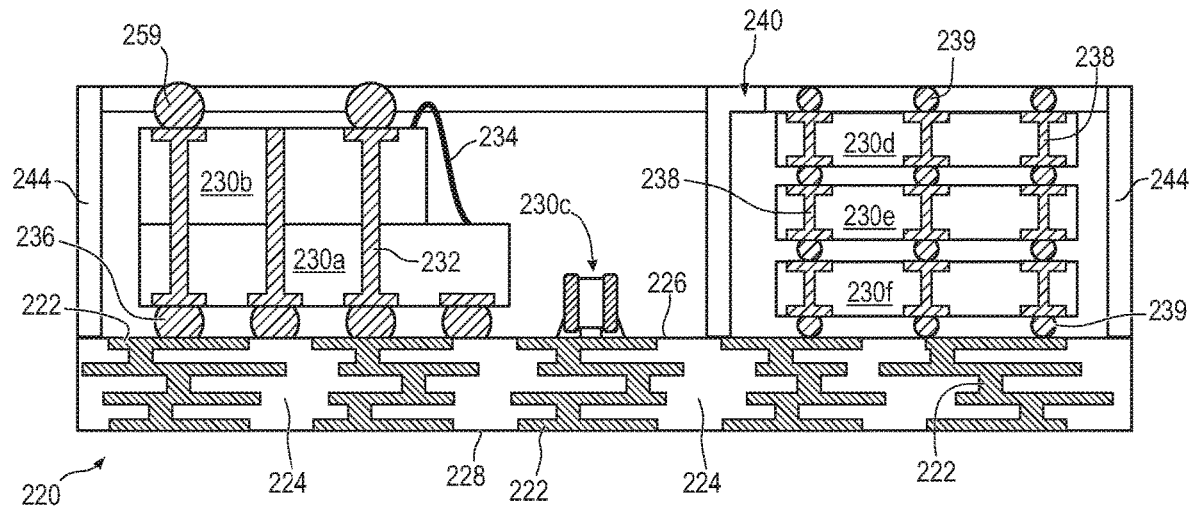
FIGS. 4a-4b illustrate a second embodiment of the semiconductor package with the support frame.

In another embodiment of forming a semiconductor package with a support frame for structural support, FIG. 4a shows a cross-sectional view of interconnect substrate or PCB 220 including conductive layers 222 and insulating layer 224. Conductive layer 222 can be one or more layers of Al, Cu, Sn, Ni, Au, Ag, or other suitable electrically conductive material. Conductive layer 222 provides horizontal electrical interconnect across substrate 220 and vertical electrical interconnect between top surface 226 and bottom surface 228 of substrate 220. Portions of conductive layer 222 can be electrically common or electrically isolated depending on the design and function of semiconductor die and other electrical components. Insulating layer 224 contains one or more layers of SiO2, Si3N4, SiON, Ta2O5, Al2O3, solder resist, polyimide, BCB, PBO, and other material having similar insulating and structural properties. Insulating layer 224 provides isolation between conductive layers 222.

A plurality of electrical components 230a-230f is mounted to or over surface 226 of interconnect substrate 220 and electrically connected to conductive layer 222. Electrical components 230a-230f are each positioned over substrate 220 using a pick and place operation. For example, electrical component 230a and 230b are stacked semiconductor die, made similar to semiconductor die 104, although possibly of a different type and functionality. Conductive vias 232 extend through stacked electrical components 230a-230b. Bond wire 234 makes electrical connection between electrical component 230a and electrical component 230b. Bumps 236 makes electrical connection between electrical components 230a-230b and interconnect substrate 220. Electrical component 230c can be discrete semiconductor device, such as a transistor, diode, capacitor, inductor, or resistor, electrically connected to conductive layer 122.

Electrical components 230d-230f are stacked semiconductor die, made similar to semiconductor die 104, although possibly of a different type and functionality. Conductive vias 238 extend through stacked electrical components 230d-230f. Bumps 239 makes electrical connection between electrical components 230d-230f and interconnect substrate 220 and other interconnect substrates. In one embodiment, electrical components 230d-230f can be embedded stacked PCBs. In another embodiment, stacked electrical components 230d-230f can be an embedded antenna, e.g. 5G antenna-in-package (AiP).

Support frame 240 is positioned over surface 226 of interconnect substrate 220. Support frame 240 follows the structure and materials of support frame 150, as in FIGS. 2d-2l. Support frame 240 is lowered into place with support braces 244 contacting surface 226 between electrical components 230a-230f, as shown in FIG. 4a. An adhesive bonds support braces 244 to surface 226 of interconnect substrate 220. In particular, support frame 240 provides structural support for electrical components, substrates, and semiconductor packages disposed above the support frame. In addition, support frame 240 provides isolation between electrical components 230a-230c and electrical component 230d-130f and external components. Support frame 240 can also provide vertical electrical interconnect, i.e., through metal vertical braces 244.

Figure 4B:
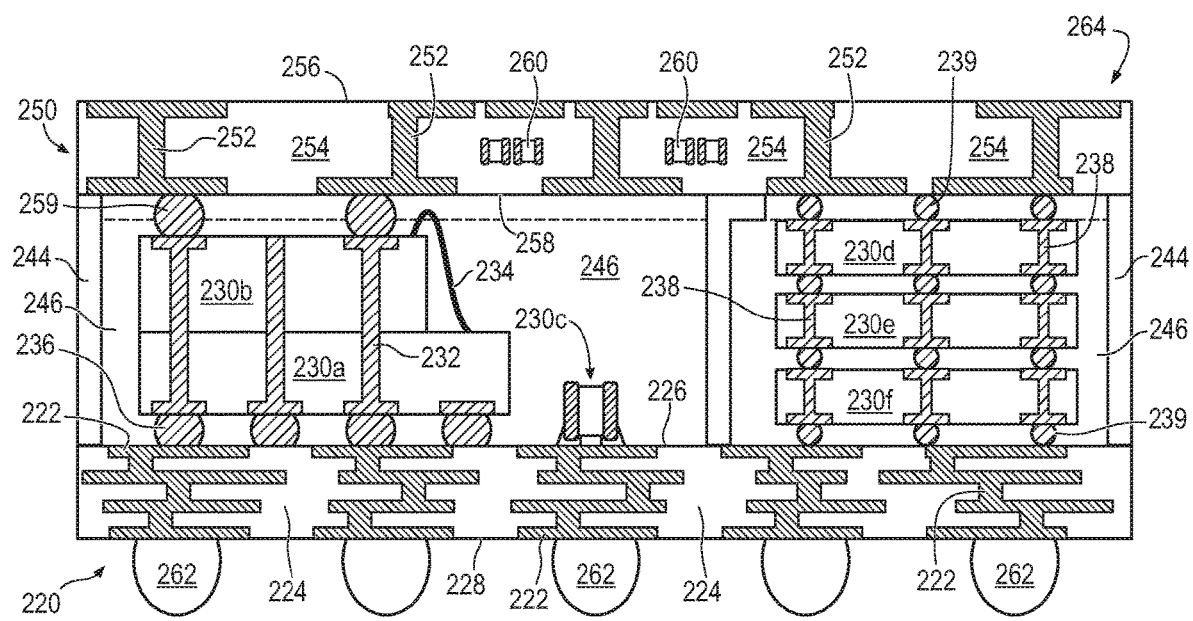

In FIG. 4b, an encapsulant or molding compound 246 is deposited over electrical components 230a-230f and surface 226 of interconnect substrate 220 and around support frame 240 using a paste printing, compressive molding, transfer molding, liquid encapsulant molding, vacuum lamination, spin coating, or other suitable applicator. Support frame 240 has an opening on at least two sides to allow for free flow of encapsulant 246 across electrical components 230a-230f and support frame 240. Encapsulant 246 can be polymer composite material, such as epoxy resin with filler, epoxy acrylate with filler, or polymer with proper filler. Encapsulant 246 is non-conductive, provides structural support, and environmentally protects the semiconductor device from external elements and contaminants.

An interconnect substrate or PCB 250 is disposed over support frame 240 and encapsulant 246, similar to FIGS. 2o-2p. Conductive layer 252 can be one or more layers of Al, Cu, Sn, Ni, Au, Ag, or other suitable electrically conductive material. Conductive layer 252 provides horizontal electrical interconnect across substrate 250 and vertical electrical interconnect between top surface 256 and bottom surface 258 of substrate 250. Portions of conductive layer 252 can be electrically common or electrically isolated depending on the design and function of semiconductor die and other electrical components. Insulating layer 254 contains one or more layers of SiO2, Si3N4, SiON, Ta2O5, Al2O3, solder resist, polyimide, BCB, PBO, and other material having similar insulating and structural properties. Insulating layer 254 provides isolation between conductive layers 252. Bumps 259 make electrical connection between electrical components 230a-230b and conductive layer 252. Bumps 239 make electrical connection between electrical components 230d-230f and conductive layer 252. Discrete electrical components 260 can be embedded between insulating layers 254 and electrically connected to conductive layers 252. Alternatively, encapsulant 246 can be deposited prior to mounting interconnect structure 250, as in FIGS. 3a-3c.

An electrically conductive bump material is deposited over conductive layer 222 on surface 228 of interconnect substrate 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form balls or bumps 262. In one embodiment, bump 262 is formed over a UBM having a wetting layer, barrier layer, and adhesive layer. Bump 262 can also be compression bonded or thermocompression bonded to conductive layer 222. Bump 262 represents one type of interconnect structure that can be formed over conductive layer 222. The interconnect structure can also use bond wires, conductive paste, stud bump, micro bump, or other electrical interconnect.

Semiconductor package 264 uses support frame 240 for structural support and isolation of electrical components 230a-230f. PCB 250 is disposed over stacked electrical components 230a-230f and provides vertical electrical interconnect. Support frame 240 provides a rigid structural support for PCB 250 and stacked electrical components 230a-230f, while reducing warpage and increasing heat dissipation through semiconductor package 264. Component stacking increases electrical functionality in a small package footprint. Support frame 240 can also provide RFI/EMI shielding for electrical components 230a-230f disposed in individual compartments 158a-158d, see FIGS. 2j, 2n. Support frame 240 can also provide a ground connection between PCB 250, through vertical support braces of support frame 240, to PCB 220 and bumps 262.

Figure 5A:
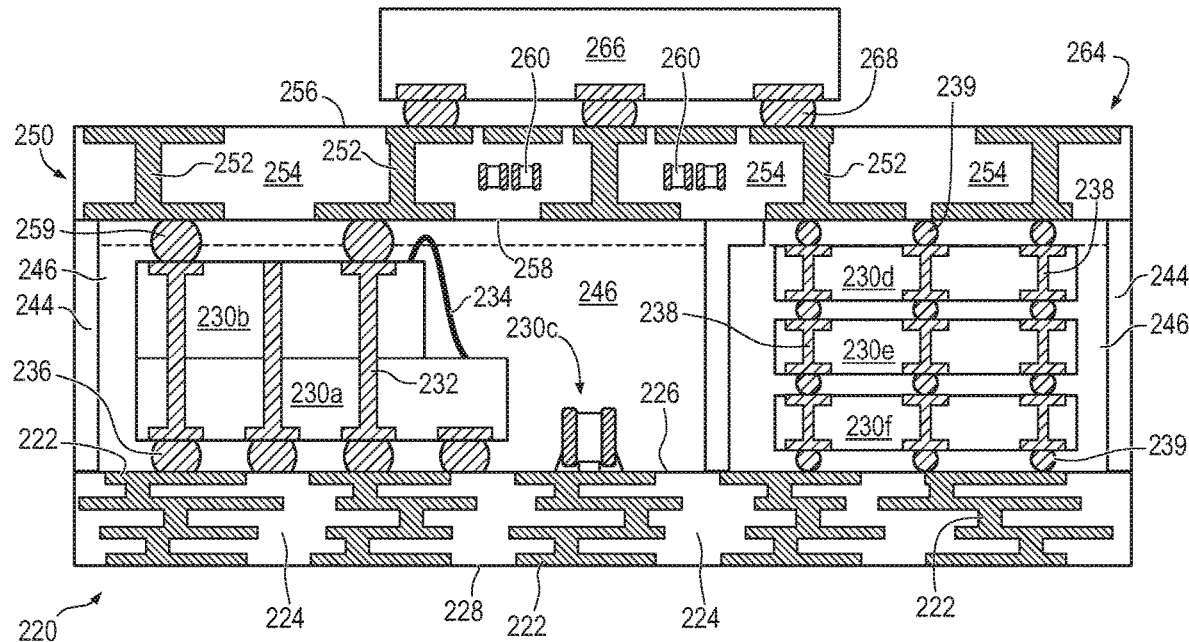
FIGS. 5a-5b illustrate a third embodiment of the semiconductor package with the support frame.

As another embodiment in FIG. 5a, continuing from FIG. 4b, electrical component or semiconductor die 266 is mounted to surface 256 of interconnect substrate 250 and electrically connected to conductive layer 252 with bumps 268, similar to FIG. 2b-2c.

Figure 5B:
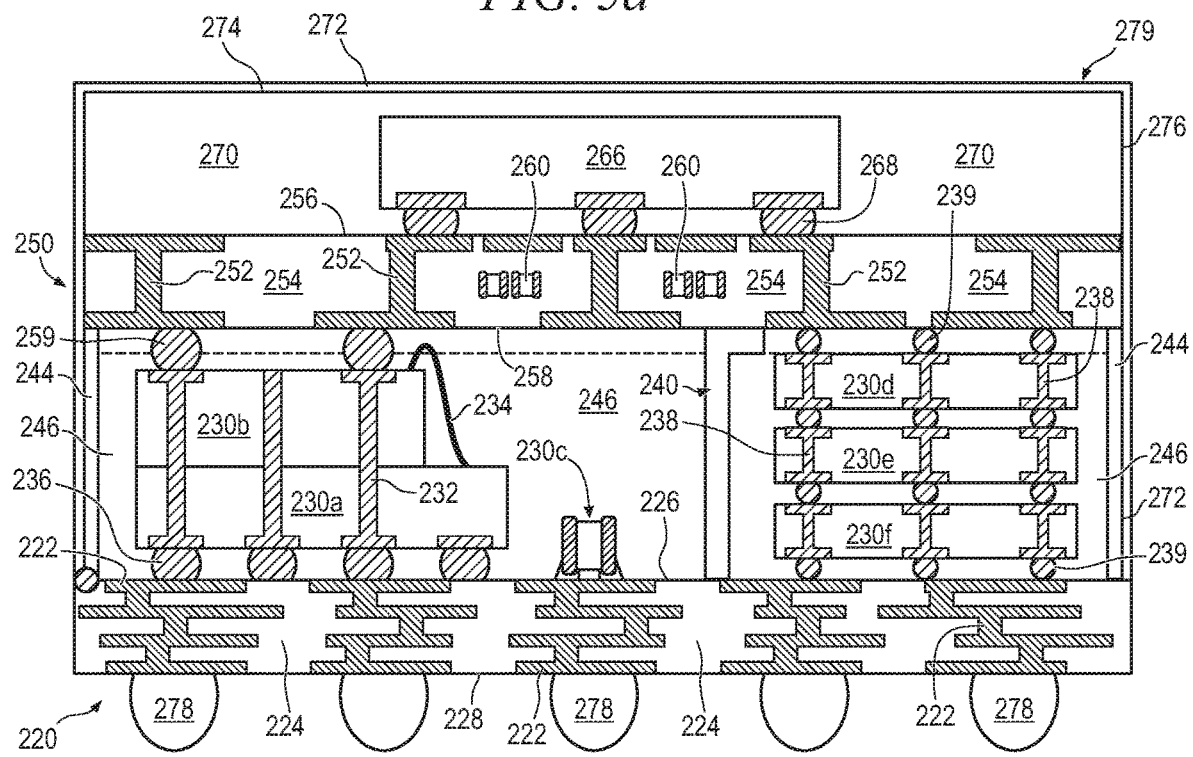

In FIG. 5b, an encapsulant or molding compound 270 is deposited over semiconductor die 266 and over interconnect structure 250, using a paste printing, compressive molding, transfer molding, liquid encapsulant molding, vacuum lamination, spin coating, or other suitable applicator. Encapsulant 270 can be polymer composite material, such as epoxy resin with filler, epoxy acrylate with filler, or polymer with proper filler. Encapsulant 270 is non-conductive, provides structural support, and environmentally protects the semiconductor device from external elements and contaminants.

Electrical components 230a-230f may contain IPDs that are susceptible to or generate EMI, RFI, harmonic distortion, and inter-device interference. For example, the IPDs contained within electrical components 230a-230f provide the electrical characteristics needed for high-frequency applications, such as resonators, high-pass filters, low-pass filters, band-pass filters, symmetric Hi-Q resonant transformers, and tuning capacitors. In another embodiment, electrical components 230a-230f contain digital circuits switching at a high frequency, which could interfere with the operation of IPDs in the semiconductor package.

In FIG. 5b, electromagnetic shielding layer 272 is formed or disposed over surface 274 of encapsulant 270 by conformal application of shielding material. Shielding layer 272 can be one or more layers of Al, Cu, Sn, Ni, Au, Ag, or other suitable conductive material. Alternatively, shielding layer 272 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 272 covers side surfaces 276 of encapsulant 270, as well as the side surface of semiconductor package 279.

An electrically conductive bump material is deposited over conductive layer 222 on surface 228 of interconnect substrate 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form balls or bumps 278. In one embodiment, bump 278 is formed over a UBM having a wetting layer, barrier layer, and adhesive layer. Bump 278 can also be compression bonded or thermocompression bonded to conductive layer 222. Bump 278 represents one type of interconnect structure that can be formed over conductive layer 222. The interconnect structure can also use bond wires, conductive paste, stud bump, micro bump, or other electrical interconnect.

Semiconductor package 279 uses support frame 240 for structural support and isolation of electrical components 230a-230f. PCB 250 is disposed over stacked electrical components 230a-230f and provides vertical electrical interconnect. Support frame 240 provides a rigid structural support for PCB 250 and stacked electrical components 230a-230f and semiconductor die 266, while reducing warpage and increasing heat dissipation through semiconductor package 279. Component stacking increases electrical functionality in a small package footprint. Support frame 240 can also provide RFI/EMI shielding for electrical components 230a-230f disposed in individual compartments 158a-158d, see FIGS. 2j, 2n. Support frame 240 can also provide a ground connection between PCB 250, through vertical support braces of support frame 240, to PCB 220 and bumps 278.

Figure 6A:
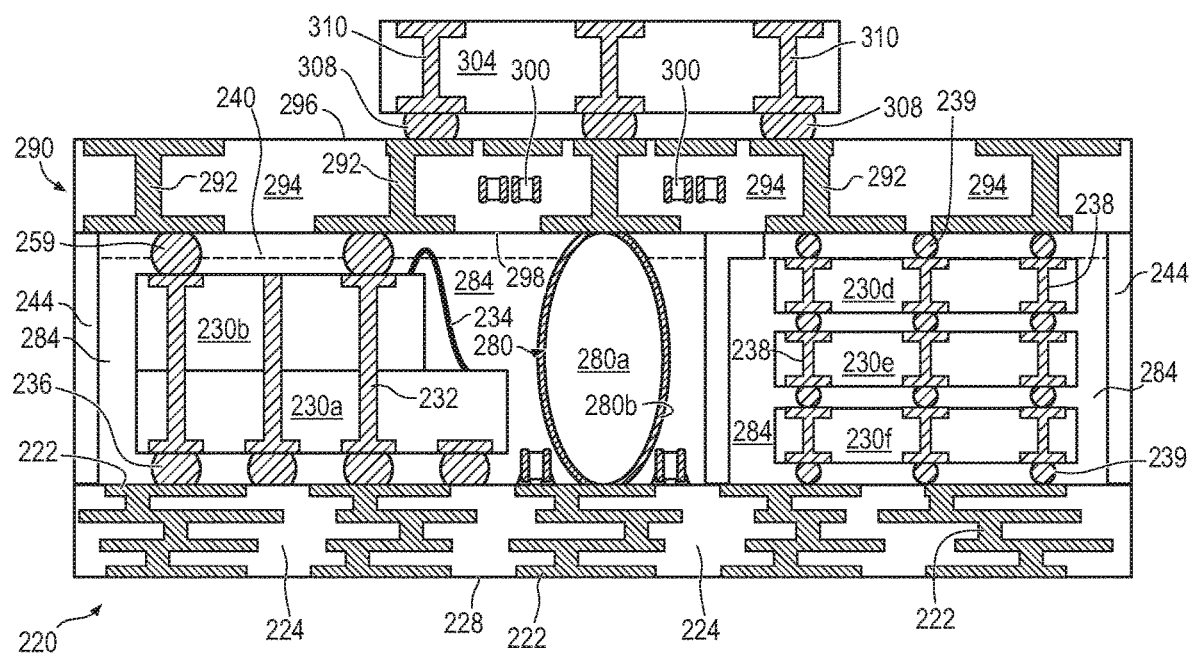
FIGS. 6a-6b illustrate a fourth embodiment of the semiconductor package with the support frame.

As another embodiment in FIG. 6a, continuing from FIG. 4a, vertical interconnect bump 280 is formed over interconnect substrate 220 and electrically connected to conductive layer 222. Bump 280 may have an inner core 280a made of polymer material and outer conductive layer 280b.

An encapsulant or molding compound 284 is deposited over electrical components 230a-230f and surface 226 of interconnect substrate 220 and around support frame 240 using a paste printing, compressive molding, transfer molding, liquid encapsulant molding, vacuum lamination, spin coating, or other suitable applicator. Support frame 240 has an opening on at least two sides to allow for free flow of encapsulant 284 across electrical components 230a-230f and support frame 240. Encapsulant 284 can be polymer composite material, such as epoxy resin with filler, epoxy acrylate with filler, or polymer with proper filler. Encapsulant 284 is non-conductive, provides structural support, and environmentally protects the semiconductor device from external elements and contaminants.

An interconnect substrate or PCB 290 is disposed over support frame 240 and encapsulant 284, similar to FIGS. 2o-2p. Conductive layer 292 can be one or more layers of Al, Cu, Sn, Ni, Au, Ag, or other suitable electrically conductive material. Conductive layer 292 provides horizontal electrical interconnect across substrate 290 and vertical electrical interconnect between top surface 296 and bottom surface 298 of substrate 290. Portions of conductive layer 252 can be electrically common or electrically isolated depending on the design and function of semiconductor die and other electrical components. Insulating layer 294 contains one or more layers of SiO2, Si3N4, SiON, Ta2O5, Al2O3, solder resist, polyimide, BCB, PBO, and other material having similar insulating and structural properties. Insulating layer 254 provides isolation between conductive layer 292. Discrete electrical components 300 can be embedded between insulating layers 294 and electrically connected to conductive layer 292. Alternatively, encapsulant 284 can be deposited after mounting interconnect structure 290, as in FIG. 2q.

An electrical component or semiconductor die 304 is mounted to surface 296 of interconnect substrate 290 and electrically connected to conductive layer 292 with bumps 308, similar to FIG. 2b-2c. Conductive vias 310 extend through semiconductor die 304 and electrically connect to bumps 308.

Figure 6B:
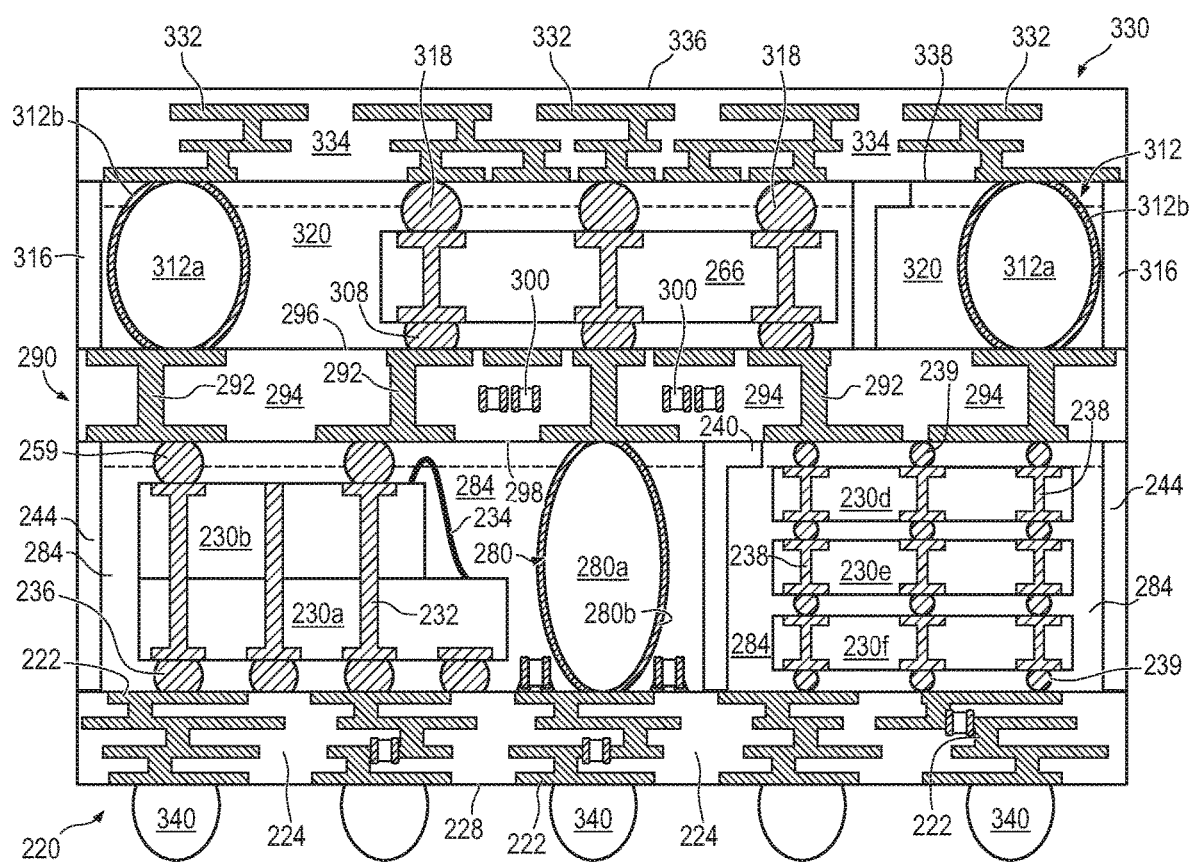

In FIG. 6b, a plurality of vertical interconnect bumps 312 is formed over interconnect substrate 290 and electrically connected to conductive layer 292. Bumps 312 may have an inner core 312a made of polymer material and outer conductive layer 312b. Support frame 316 is mounted to interconnect substrate 290, similar to support frame 150 in FIGS. 2d-2l. Bumps 318 are formed over semiconductor die 304 and electrically connected to conductive vias 310.

An encapsulant or molding compound 320 is deposited over semiconductor die 304 and bumps 312, using a paste printing, compressive molding, transfer molding, liquid encapsulant molding, vacuum lamination, spin coating, or other suitable applicator. Support frame 316 has an opening on at least two sides to allow for free flow of encapsulant 320 across electrical components 230a-230f and support frame 316. Encapsulant 320 can be polymer composite material, such as epoxy resin with filler, epoxy acrylate with filler, or polymer with proper filler. Encapsulant 320 is non-conductive, provides structural support, and environmentally protects the semiconductor device from external elements and contaminants.

An interconnect substrate or PCB 330 is disposed over support frame 316 and encapsulant 320, similar to FIGS. 2o-2p. Conductive layer 332 can be one or more layers of Al, Cu, Sn, Ni, Au, Ag, or other suitable electrically conductive material. Conductive layer 332 provides horizontal electrical interconnect across substrate 330 and vertical electrical interconnect between top surface 336 and bottom surface 338 of substrate 330. Portions of conductive layer 332 can be electrically common or electrically isolated depending on the design and function of semiconductor die and other electrical components. Insulating layer 334 contains one or more layers of SiO2, Si3N4, SiON, Ta2O5, Al2O3, solder resist, polyimide, BCB, PBO, and other material having similar insulating and structural properties. Insulating layer 334 provides isolation between conductive layer 332.

An electrically conductive bump material is deposited over conductive layer 222 on surface 228 of interconnect substrate 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form balls or bumps 340. In one embodiment, bump 340 is formed over a UBM having a wetting layer, barrier layer, and adhesive layer. Bump 340 can also be compression bonded or thermocompression bonded to conductive layer 222. Bump 340 represents one type of interconnect structure that can be formed over conductive layer 222. The interconnect structure can also use bond wires, conductive paste, stud bump, micro bump, or other electrical interconnect.

Semiconductor package 330 uses support frames 240 and 316 for structural support and isolation of electrical components 230a-230f. PCB 290 is disposed over stacked electrical components 230a-230f and provides vertical electrical interconnect. Support frames 240 and 316 provide a rigid structural support for PCB 250 and stacked electrical components 230a-230f and semiconductor die 304 and PCB 330, while reducing warpage and increasing heat dissipation through semiconductor package 342. Component stacking increases electrical functionality in a small package footprint. Support frames 240 and 316 can also provide RFI/EMI shielding for electrical components 230a-230f disposed in individual compartments 158a-158d, see FIGS. 2j, 2n. Support frames 240 and 316 can also provide a ground connection between PCB 330, through vertical support braces of support frames 240 and 316, to PCB 290 and bumps 340.

Figure 7:
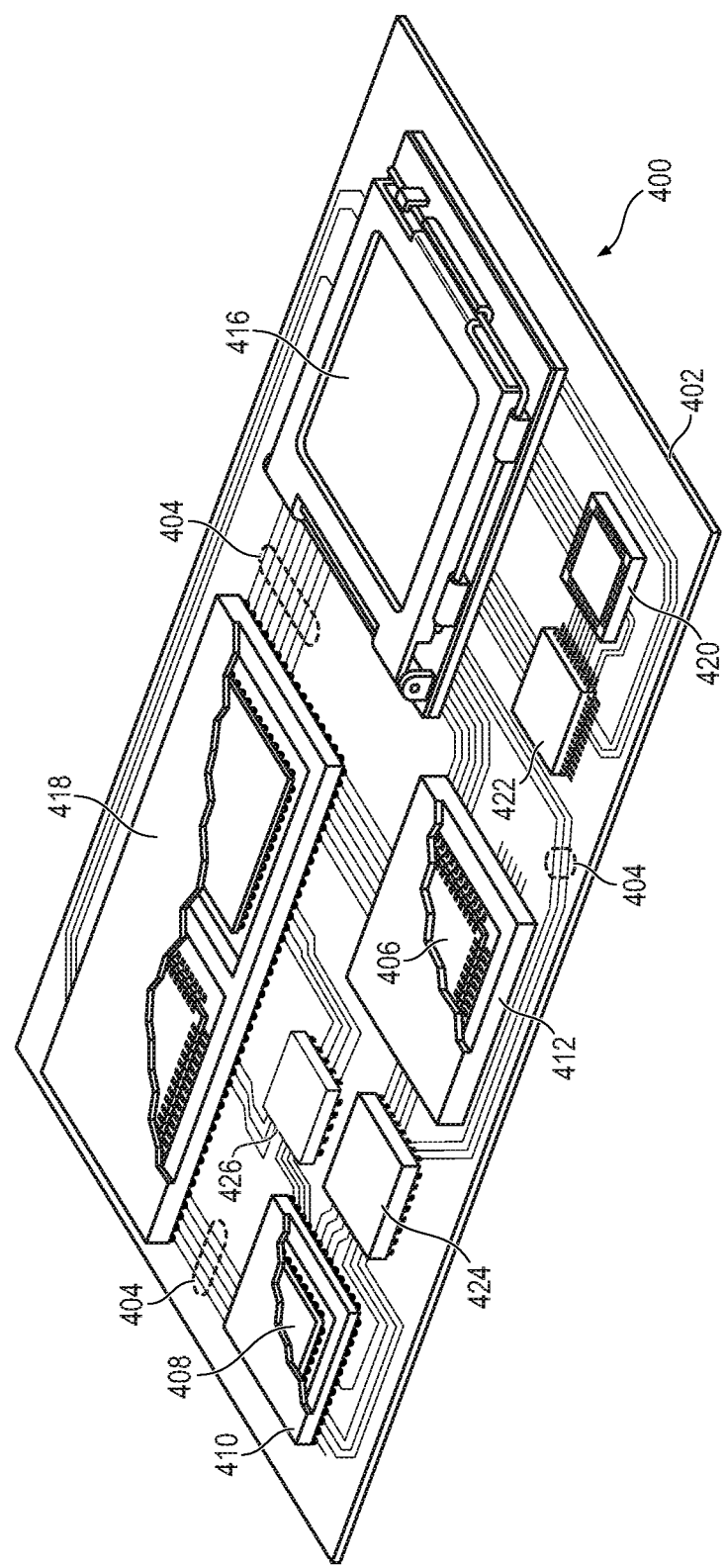
FIG. 7 illustrates a printed circuit board (PCB) with different types of packages mounted to a surface of the PCB.

FIG. 7 illustrates electronic device 400 having a chip carrier substrate or PCB 402 with a plurality of semiconductor packages mounted on a surface of PCB 402, including semiconductor packages 186, 212, 264, 279, and 330. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 7, PCB 402 provides a general substrate for structural support and electrical interconnect of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown mounted on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first substrate;
   a first electrical component disposed over the first substrate;
   a second electrical component disposed over the first substrate;
   a support frame disposed over the first substrate around the first electrical component and second electrical component, wherein the support frame includes a horizontal support channel disposed with separation from the first substrate and a vertical support brace extending from the horizontal support channel to the first substrate; and
   an encapsulant deposited around the first electrical component, the second electrical component, and a portion of the support frame.

2. The semiconductor device of claim 1, wherein the first electrical component is disposed within a first compartment of the support frame, and the second electrical component is disposed within a second compartment of the support frame.

3. The semiconductor device of claim 1, further including a third electrical component disposed over the first electrical component.

4. The semiconductor device of claim 1, further including a third electrical component disposed over the second electrical component.

5. The semiconductor device of claim 1, further including a second substrate disposed over the support frame.

6. A semiconductor device, comprising:
   a first substrate;
   a first electrical component disposed over the first substrate;
   a support frame disposed over the first substrate around the first electrical component, wherein the support frame includes a horizontal support channel disposed apart from the first substrate and a vertical support brace extending from the horizontal support channel to the first substrate; and
   an encapsulant deposited around the first electrical component and a portion of the support frame.

7. The semiconductor device of claim 6, further including a second electrical component disposed over the first substrate.

8. The semiconductor device of claim 7, wherein the first electrical component is disposed within a first compartment of the support frame, and the second electrical component is disposed within a second compartment of the support frame.

9. The semiconductor device of claim 7, further including a third electrical component disposed over the second electrical component.

10. The semiconductor device of claim 6, further including a second electrical component disposed over the first electrical component.

11. The semiconductor device of claim 6, further including a second substrate disposed over the support frame.

12. A method of making a semiconductor device, comprising:
    providing a first substrate;
    disposing a first electrical component over the first substrate;
    disposing a second electrical component over the first substrate;
    disposing a support frame over the first substrate around the first electrical component and second electrical component, wherein the support frame includes a horizontal support channel disposed with separation from the first substrate and a vertical support brace extending from the horizontal support channel to the first substrate; and
    depositing an encapsulant around the first electrical component, the second electrical component, and a portion of the support frame.

13. The method of claim 12, further including:
    disposing the first electrical component within a first compartment of the support frame; and
    disposing the second electrical component within a second compartment of the support frame.

14. The method of claim 12, further including disposing a third electrical component over the first electrical component.

15. The method of claim 12, further including disposing a third electrical component over the second electrical component.

16. The method of claim 12, further including disposing a second substrate over the support frame.

17. A method of making a semiconductor device, comprising:
    providing a first substrate;
    disposing a first electrical component over the first substrate;
    disposing a support frame over the first substrate around the first electrical component, wherein the support frame includes a horizontal support channel disposed apart from the first substrate and a vertical support brace extending from the horizontal support channel to the first substrate; and
    depositing an encapsulant around the first electrical component and a portion of the support frame.

18. The method of claim 17, further including disposing a second electrical component over the first substrate.

19. The method of claim 18, further including disposing a third electrical component over the second electrical component.

20. The method of claim 17, further including disposing a second electrical component over the first electrical component.

21. The method of claim 17, further including disposing a second substrate over the support frame.

\* \* \* \* \*